United States Patent
Shin et al.

(10) Patent No.: US 8,810,776 B2
(45) Date of Patent: Aug. 19, 2014

(54) MASK AND OPTICAL FILTER MANUFACTURING APPARATUS INCLUDING THE SAME

(71) Applicants: Bu Gon Shin, Daejeon (KR); Sin Young Kim, Daejeon (KR); Jae Jin Kim, Daejeon (KR); Da Mi Lee, Daejeon (KR)

(72) Inventors: Bu Gon Shin, Daejeon (KR); Sin Young Kim, Daejeon (KR); Jae Jin Kim, Daejeon (KR); Da Mi Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/946,872

(22) Filed: Jul. 19, 2013

(65) Prior Publication Data

US 2013/0301026 A1    Nov. 14, 2013

Related U.S. Application Data

(63) Continuation of application No. PCT/KR2012/005850, filed on Jul. 23, 2012.

(30) Foreign Application Priority Data

Jul. 21, 2011    (KR) .................. 10-2011-0072628
Jul. 20, 2012    (KR) .................. 10-2012-0079540

(51) Int. Cl.
*G03F 1/38*    (2012.01)

(52) U.S. Cl.
USPC .................................. 355/71; 430/5

(58) Field of Classification Search
USPC ...................... 430/5, 394; 355/47, 55, 71
See application file for complete search history.

(56) References Cited

U.S. PATENT DOCUMENTS

| 6,416,908 B1 * | 7/2002 | Klosner et al. ................. 430/5 |
| 6,906,346 B2 | 6/2005 | Nishitani et al. |
| 2009/0130607 A1 * | 5/2009 | Slafer ......................... 430/323 |

FOREIGN PATENT DOCUMENTS

| JP | 08-222497 A | 8/1996 |
| JP | 2004-006849 A | 1/2004 |
| JP | 2010-060681 A | 3/2010 |

* cited by examiner

*Primary Examiner* — Stephen Rosasco
(74) *Attorney, Agent, or Firm* — McKenna Long & Aldridge LLP

(57) ABSTRACT

A mask and an optical filter manufacturing apparatus including the same are provided. A mask used for a roll-to-roll process of forming patterns in a base film configured to move along a curved surface includes a mask body having a curved surface disposed opposite a roll around which the base film is wound and a plane surface corresponding to the reverse side of the curved surface. The curved surface of the mask body is disposed a predetermined distance apart from a curved surface of the roll. The mask and optical filter manufacturing apparatus enable formation of uniform patterns on the base film to enhance the quality of products and precisely attain the properties of the base film.

15 Claims, 3 Drawing Sheets

MASK AND OPTICAL FILTER MANUFACTURING APPARATUS INCLUDING THE SAME

This application is a Continuation Bypass Application of International Application No. PCT/KR2012/005850, filed Jul. 23, 2012, and claims the benefit of Korean Application Nos. 10-2011-0072628 filed on Jul. 21, 2011 and 10-2012-0079540 filed on Jul. 20, 2012, all of which are hereby incorporated by reference in their entirety for all purposes as if fully set forth herein.

BACKGROUND

1. Field of the Invention

The present invention relates to an optical filter manufacturing apparatus, and more particularly, to a mask having a curved shape having predetermined openings and an optical filter manufacturing apparatus including the same, which have a high patterning precision irrespective of a distance between the mask and a base film, and are applicable to a roll-to-roll process.

2. Discussion of Related Art

In recent years, a technique of aligning light by irradiating an alignment layer of a liquid crystal display (LCD) or a viewing angle compensation base film layer with polarized light having a predetermined wavelength, using a method of providing alignment performance to the alignment layer, has widely been used. Conventionally, combinations of a rod-shaped lamp, which is a linear light source, with a wire grid polarizer (WGP) as described in Korean Patent Publication No. 2006-0053117 and Korean Patent Publication No. 2009-0112546 have been used as polarized light radiation devices for light alignment layers.

The light alignment technique has been scaled up with the scaling-up of liquid crystal (LC) panels. Thus, a light irradiation region having a larger area has been irradiated at a higher luminance by a light radiation device configured to radiate polarized light at the light alignment layer.

To irradiate a large area with light at a high luminance, a light source of the light radiation device should be scaled up accordingly. Since a direction of polarized light that determines alignment is dependent on the incidence angle of incident light, when the light source is scaled up, nonuniformity in incidence angle occurs in the light irradiation region, thus resulting in nonuniformity in a polarization axis. As a result, an alignment direction is not uniform according to an irradiation region so that light may be aligned in an undesired direction.

Furthermore, in a roll-to-roll process, there are many cases where light irradiation regions have curved surfaces. In these cases, as the area of the light irradiation regions increases, nonuniformity in a polarization axis caused by the curved surfaces may become more problematic in the light irradiation regions.

To obtain a uniform polarization distribution over a large area, highly collimated light should be incident on a polarization device. A large apparatus is required to generate highly collimated light corresponding to a large area. Since the intensity of light decreases as the length of a light path of the apparatus increases, a processing time increases, thus degrading productivity. In conclusion, to generate collimated light, it is difficult to embody optical properties without the enlarging apparatus. As a result, a roll-to-roll process cannot be performed, thereby resulting in a remarkable drop in productivity.

SUMMARY OF THE INVENTION

The present invention is directed to providing a mask and an optical filter manufacturing apparatus including the same, which may uniformly expose a large area to light, enable radiation of highly collimated light, provide uniform alignment performance, and efficiently perform a light alignment operation over a large area.

The technical objectives of the present invention are not limited to the above disclosure; other objectives may become apparent to those of ordinary skill in the art based on the following descriptions.

One aspect of the present invention provides a mask used for a roll-to-roll process of forming patterns in a base film configured to move along a curved surface. The mask includes a mask body having a curved surface disposed opposite a roll around which the base film is wound and a plane surface corresponding to the reverse side of the curved surface.

The curved surface of the mask body may be disposed a predetermined distance apart from a curved surface of the roll.

A metal thin layer may be formed on the curved surface of the mask body.

The metal thin layer may be a chrome (Cr) or aluminum (Al) thin layer.

At least one opening for forming the patterns in the base film may be formed in the metal thin layer.

The openings may be processed using a laser direct-writing technique.

Inner walls of the openings may be formed to a smaller width toward lower portions thereof.

A total reflective layer may be formed on the inner walls of the openings to increase the linearity of light.

Openings for forming the patterns in the base film may be formed in the mask body.

The curved surface of the mask body may have the same curvature as the roll.

The base film may be maintained a distance of about 100 μm or less apart from the mask body.

The mask may include jig fixing units included on both sides of the mask body and fixed to jigs.

The jig fixing units may be formed by processing both sides of the mask body having the curved surface in steps, and a plurality of mounting holes may be formed in the jig fixing units.

Another aspect of the present invention provides an optical filter manufacturing apparatus using a roll-to-roll process of forming patterns in a base film configured to move along a curved surface. The apparatus includes a light source configured to generate light used for an exposure process, a polarizer installed at an emission side of the light source and configured to polarize the light generated by the light source, and the above-described mask.

The light source may be an ultraviolet (UV) lamp.

The polarizer may be a wire grid polarizer (WGP).

Effect

According to the present invention, since a surface of a mask disposed opposite a roll is formed as a curved type to uniformize a distance between the mask and a base film configured to move along the roll, light can be radiated onto the entire surface of the base film with uniform luminance. Therefore, patterns can be uniformly formed on the base film so that the quality of products can be enhanced and the properties of the base film can be precisely embodied.

DETAILED DESCRIPTION OF EXEMPLARY EMBODIMENTS

A mask and an optical filter manufacturing apparatus according to the present invention will be described more fully hereinafter with reference to the accompanying drawings, in which exemplary embodiments of the invention are shown.

Figure 1:
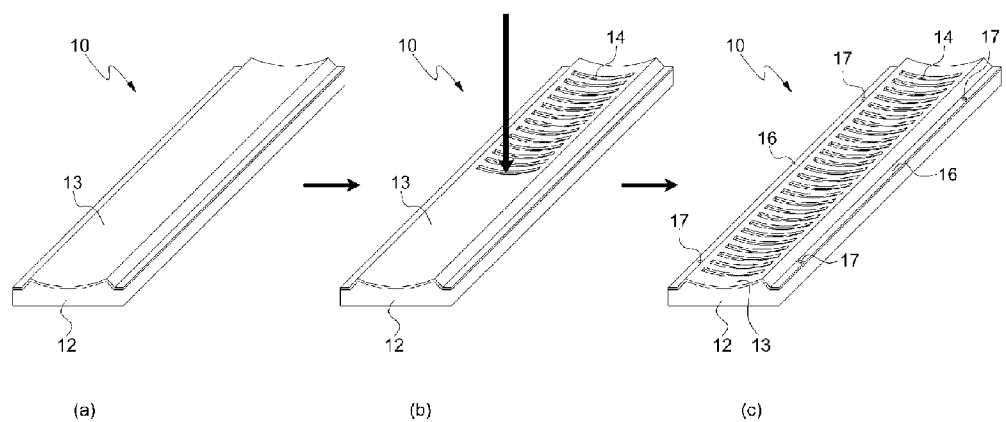
FIG. 1 is a perspective view of a mask according to an exemplary embodiment of the present invention.
Figure 2:
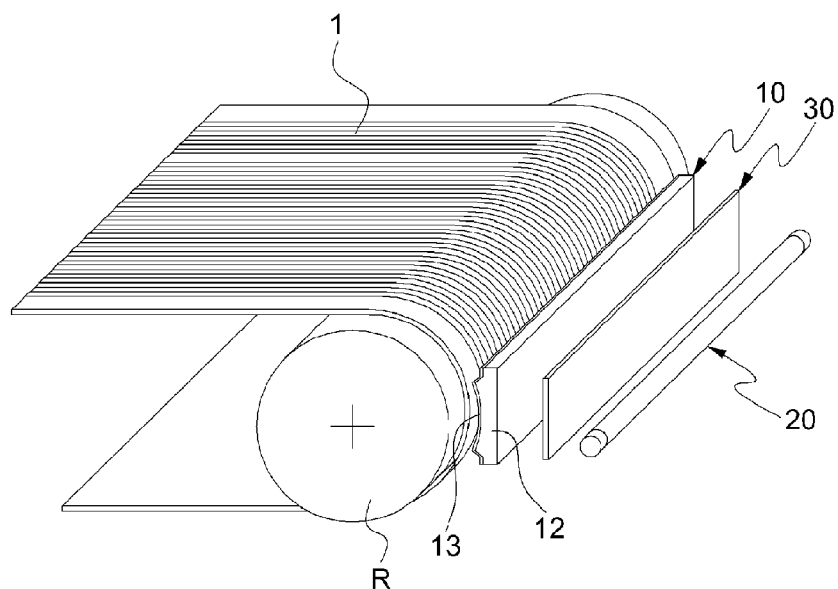
FIG. 2 is a perspective view of an optical filter manufacturing apparatus according to an exemplary embodiment of the present invention.
Figure 3:
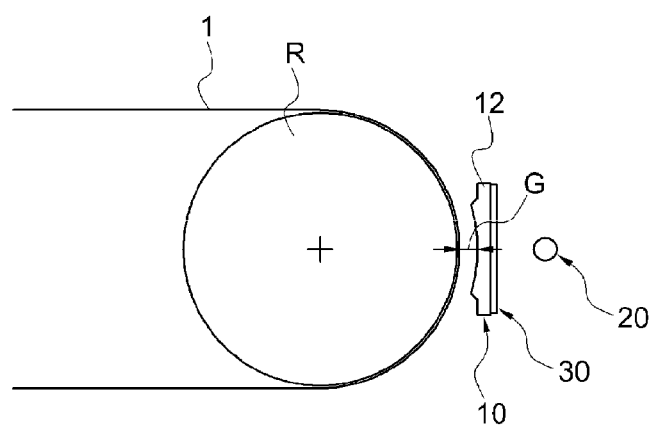
FIG. 3 is a lateral view of an optical filter manufacturing apparatus according to an exemplary embodiment of the present invention.

FIG. 1 is a perspective view of a mask according to an exemplary embodiment of the present invention, FIG. 2 is a perspective view of an optical filter manufacturing apparatus according to an exemplary embodiment of the present invention, and FIG. 3 is a lateral view of an optical filter manufacturing apparatus according to an exemplary embodiment of the present invention.

Referring to FIGS. 1 and 2, a mask according to the present invention may include a mask body 12 having a curved surface disposed opposite a roll R around which a base film 1 is wound and a plane surface corresponding to the reverse side of the curved surface.

The mask body 12 may be typically formed of a quartz base material. In the present embodiment, the mask body 12 may have the curved surface facing the roll R to minimize a distance G between the mask body 12 and the base film 1. The mask body 12 may have the same curvature as the roll R. Also, the mask body 12 may have the plane surface corresponding to the reverse side of the curved surface to mount jigs (not shown).

Furthermore, a metal thin layer 13 may be deposited on the curved surface of the mask body 12 disposed opposite the roll R. For example, a chrome (Cr) or aluminum (Al) thin layer may be deposited as the metal thin layer 13. When the metal thin layer 13 is deposited, an optical transmittance may be reduced so that light can be focused on openings 14 that will be described later.

Next, at least one opening 14 for forming patterns in the base film 1 may be formed in the metal thin layer 13. The openings 14 may be formed by processing the metal thin layer 13 deposited on the mask body 12 using a laser direct-writing technique. Referring to FIG. 1, it can be seen that after the metal thin layer 13 is formed on the mask body 12, the openings 14 are formed by laser-processing the metal thin layer 13.

Here, the openings 14 may be formed only in the metal thin layer 13 but not in the mask body 12. The mask body 12 formed of a quartz base may transmit ultraviolet (UV) light, while the metal thin layer 13 has a low optical transmittance. Thus, when the openings 14 are formed only in the metal thin layer 13, light may be focused on the openings 14 to form the patterns. Also, the openings 14 may increase the linearity of light and improve the uniformity of the patterns.

More specifically, a roll-to-roll process may include transferring the base film 1 along the curved surface of the mask body 12 during an exposure process for forming the patterns. When the patterns are formed using a roll-to-roll process, light is substantially radiated during the transfer of the base film 1 along the curved surface; otherwise, some portions of the base film 1 may not be tightened but rather be wrinkled, preventing a uniform exposure process.

To form the patterns, a mask 10 should be mounted between the base film 1 and an ultraviolet (UV) lamp 20 required for exposure. Since one surface of an exposure device is a curved surface, it may be impossible to closely adhere the mask body 12 to the base film 1, so that the patterns may not be uniformly formed. To overcome this drawback, in the present embodiment, predetermined openings 14 may be formed in the mask body 12. By forming the openings 14 and radiating light along the guide slits 14, the linearity of light may be improved to increase the uniformity of the patterns formed in the base film 1. In other words, even if the mask body 12 is spaced a predetermined distance apart from the base film 1, the linearity of light may be improved.

Meanwhile, the base film 1 may be maintained a distance of about 100 µm or less apart from the mask body 12. When a distance between the base film 1 and the mask body 12 exceeds about 100 µm, improving the linearity of light may be difficult.

Referring to FIG. 3, the curved surface of the mask body 12 may be disposed a predetermined distance G apart from a curved surface of the roll R. Thus, light irradiated to the base film 1 closely adhered to the curved surface of the roll R may be uniformly incident to increase the uniformity of the patterns. In other words, since light irradiated to a path along which the base film 1 moves is irradiated at regular intervals, light may be uniformly incident.

Figure 4:
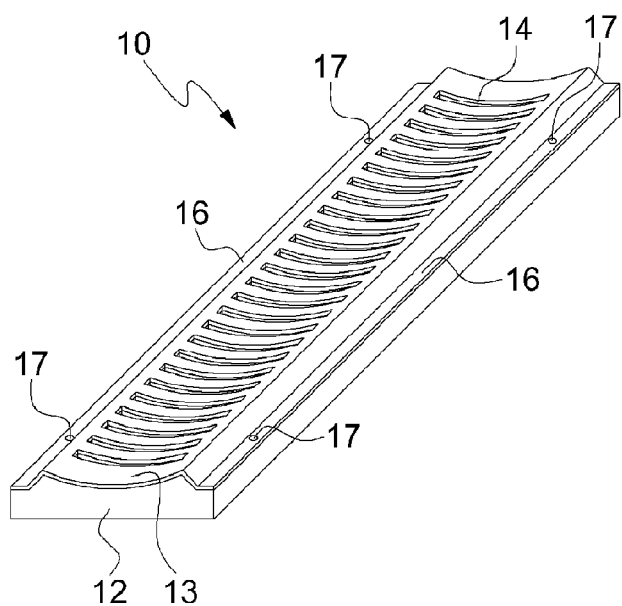
FIG. 4 is a perspective view of a mask according to another exemplary embodiment of the present invention.

Meanwhile, referring to FIG. 4, openings 14 may be formed through both the mask body 12 and the metal thin layer 13 instead of forming the openings 14 only in the metal thin layer 12 as described above.

Figure 5:
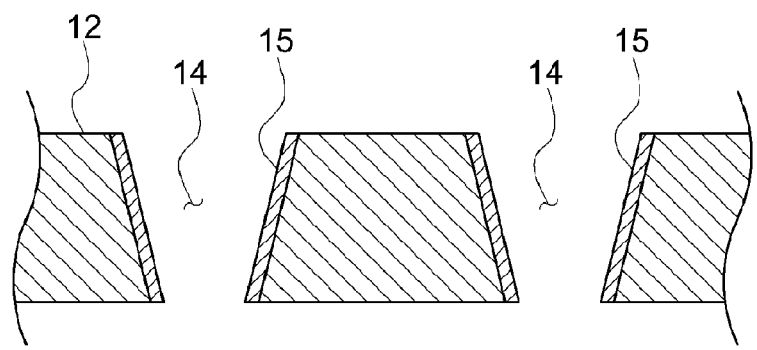
FIG. 5 is a cross-sectional view of the shape of openings according to another exemplary embodiment of the present invention.

Furthermore, referring to FIG. 5, the shape of the openings 14 of the mask 10 according to the present invention may be modified to improve the linearity of light. That is, although opposite inner walls of the openings 14 are typically formed parallel to one another, the inner walls of the openings 14 may be formed to a smaller width toward lower portions thereof.

In addition, the mask 10 according to the present invention may be configured such that the inner walls of the openings 14 are coated with a total reflective layer 15 to improve the linearity of light. For example, a reflective material, such as aluminum (Al), copper (Cu), nickel (Ni), gold (Au), or platinum (Pt), may be coated on the inner walls of the openings 14 using a deposition process.

Meanwhile, as shown in FIG. 1, the jig fixing units 16 may be formed by processing both sides of the mask body 12 having the curved surface in steps. Also, a plurality of mounting holes 17 may be formed in the jig fixing units 16 so that the jig fixing units 16 may be mounted at jigs (not shown) by connecting tools, such as bolts.

Next, referring to FIG. 2, an optical filter manufacturing apparatus according to the present invention may include a light source configured to generate light for an exposure process, a polarizer 30 installed at an emission side of the light source and configured to polarize the light generated by the light source, and the above-described mask 10.

Although various kinds of light sources may be adopted, in the present embodiment, a UV lamp 20 may be used. Also, the polarizer 30 may be a wire grid polarizer (WGP). Here, the polarizer 30 may be adhered to the plane surface of the mask body 12. Light radiated by the UV lamp 20 may be polarized by the polarizer 30 and radiated through the openings 14 toward the base film 1.

In the present embodiment, the base film 1 may be a film patterned retarder (FPR).

Meanwhile, the above-described optical filter manufacturing apparatus may be applied to a 3-dimensional (3D) image device. Accordingly, manufacture of a 3D optical filter may be enabled using the optical filter manufacturing apparatus according to the present invention.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An optical filter manufacturing apparatus using a roll-to-roll process forming patterns in a base film configured to move along a curved surface, comprising:
   a light source generating light;
   a polarizer installed on an emission side of the light source such that light generated by the light source is polarized by the polarizer;
   a roll, wherein the base film is wound around the roll; and
   a mask positioned between the polarizer and the roll, comprising a mask body having a curved surface disposed so as to face the roll around which the base film is wound.

2. The optical filter manufacturing apparatus according to claim 1, wherein the curved surface of the mask body is disposed a predetermined distance apart from a curved surface of the roll.

3. The optical filter manufacturing apparatus according to claim 1, wherein a metal thin layer is deposited on the curved surface of the mask body.

4. The optical filter manufacturing apparatus according to claim 3, wherein the metal thin layer is a chrome Cr or aluminum Al thin layer.

5. The optical filter manufacturing apparatus according to claim 3, wherein at least one opening for forming the patterns in the base film is formed in the metal thin layer.

6. The optical filter manufacturing apparatus according to claim 5, wherein openings are processed using a laser direct-writing technique.

7. The optical filter manufacturing apparatus according to claim 5, wherein inner walls of openings are formed to a smaller width toward lower portions thereof.

8. The optical filter manufacturing apparatus according to claim 5, wherein a total reflective layer is formed on inner walls of openings to increase the linearity of light.

9. The optical filter manufacturing apparatus according to claim 3, wherein openings for forming the patterns in the base film are formed in the mask body and the metal thin layer.

10. The optical filter manufacturing apparatus according to claim 1, wherein the curved surface of the mask body has the same curvature as the roll.

11. The optical filter manufacturing apparatus according to claim 1, wherein the base film is maintained a distance of about 100 μm or less apart from the mask body.

12. The optical filter manufacturing apparatus according to claim 1, further comprising jig fixing units included on both sides of the mask body and fixed to jigs.

13. The optical filter manufacturing apparatus according to claim 12, wherein the jig fixing units are formed by processing both sides of the mask body having the curved surface in steps, and a plurality of mounting holes are formed in the jig fixing units.

14. The optical filter manufacturing apparatus according to claim 1, wherein the light source is an ultraviolet UV lamp.

15. The optical filter manufacturing apparatus according to claim 1, wherein the polarizer is a wire grid polarizer WGP.

* * * * *